United States Patent [19]

Szolgyemy

[11] Patent Number: 4,939,103
[45] Date of Patent: Jul. 3, 1990

[54] METHOD OF DIFFUSING PLURALITY OF DOPANTS SIMULTANEOUSLY FROM VAPOR PHASE INTO SEMICONDUCTOR SUBSTRATE

[75] Inventor: Laszlo Szolgyemy, Bromont, Canada

[73] Assignee: Mitel Corporation, Ontario, Canada

[21] Appl. No.: 655,439

[22] Filed: Sep. 28, 1984

[30] Foreign Application Priority Data

May 18, 1984 [CA] Canada ............................... 454727

[51] Int. Cl.$^5$ .................................. H01L 21/223
[52] U.S. Cl. ................................ 437/151; 437/165; 437/987
[58] Field of Search ............... 148/DIG. 30, DIG. 37, 148/DIG. 38, DIG. 40; 437/151, 152, 165, 987

[56] References Cited

U.S. PATENT DOCUMENTS

| | | | |
|---|---|---|---|
| 3,492,175 | 1/1970 | Conrad et al. | 148/188 X |
| 3,764,414 | 10/1973 | Blum et al. | 148/189 |
| 3,829,382 | 8/1974 | Tucker | 148/189 X |
| 3,916,034 | 10/1975 | Tsuchimoto | 427/38 |
| 3,948,696 | 4/1976 | Inaniwa et al. | 148/189 |
| 3,949,119 | 4/1976 | Shewchun et al. | 427/85 |
| 4,204,893 | 5/1980 | Cox | 29/571 X |
| 4,233,093 | 11/1980 | Chow | 148/189 |
| 4,525,224 | 6/1985 | Vlasak | 148/189 |
| 4,526,632 | 7/1985 | Nishizawa et al. | 148/189 X |
| 4,618,381 | 10/1986 | Sato et al. | 148/189 |

OTHER PUBLICATIONS

Vossen et al., Thin Film Processes, Academic Press, 1978, pp. 285–289.
Gandhi "VLSI Fabrication Principles", John Wiley & Sons, N.Y. 1983, pp. 157–171 and 185–190.
Warner et al "Integrated Circuits", McGraw-Hill N.Y. 1965, pp. 289–296.
Hamilton et al. "Basic Integrated Circuit Engineering", McGraw-Hill, N.Y. 1975, pp. 34–36.
Fogiel "Modern Microelectronic Circuit Design, IC Applications, Fabrication Technology" vol. 1, Research & Education Ass'n, N.Y. 1981, pp. 329–333.

Primary Examiner—Olik Chaudhuri
Attorney, Agent, or Firm—Antonelli, Terry, Stout & Kraus

[57] ABSTRACT

This invention relates to the manufacture of semiconductor devices and more particularly to a method of diffusing an impurity layer into a substrate. The disclosed method comprises the steps of placing a body of semiconductor in a vacuum doping chamber, evacuating air from the chamber, subjecting the body to a dopant in the form of a gas or vapor while simultaneously heating the chamber to at least the diffusion temperature. The diffusion process is controlled by monitoring and controlling the pressure and the temperature of the dopant gas in the chamber. The diffusion method can also be carried out with the further admittance of a reactive gas or with the further admittance of a second dopant gas and a reactive gas together.

7 Claims, 1 Drawing Sheet

METHOD OF DIFFUSING PLURALITY OF DOPANTS SIMULTANEOUSLY FROM VAPOR PHASE INTO SEMICONDUCTOR SUBSTRATE

BACKGROUND OF THE INVENTION

1. Field of the Invention

This invention relates to the manufacture of semiconductor devices and more particularly relates to a process for the deposition and diffusion of an impurity into a semiconductor substrate.

2. Art Background

One of the most important steps in a process for fabricating semiconductors is the diffusion of impurities into a semiconductor substrate. One of the usual first steps of this process is the deposition of a controlled quantity of impurities into a surface film of the semiconductor. The impurities are then distributed and driven into the semiconductor as a result of high temperature solid state diffusion. While the second step has in the past been reasonably well defined and controlled, the first step has been subject to more variation.

One of the most widely used deposition methods is known as hot wall open tube furnace deposition. In this method, semiconductor substrates are held on carriers and placed into a furnace which is purged by a controlled gas composition. Dopant impurities in gas or vapor form are mixed into the purging gas in a predetermined concentration. A generally accepted explanation of the process is that active dopant molecules rapidly react with the semiconductor surface and as a result a stagnant dopant-free gas film develops above the semiconductor surface. Deposition of dopant molecules into the surface occurs as a result of diffusion through the stagnant gas film. The stagnant dopant free gas film impedes the diffusion process, and as a result, doping speed is defined by a complicated function of temperature, composition and fluid properties of the gas, and surface properties of the semiconductor. Simultaneous control over all of these parameters is difficult. Consequently, control over the entire doping process is rather poor. Also, because of the generally very high concentration of dopant atoms on the surface of the semiconductor body, lattice distortions tend to occur which detract from the desired electronic characteristics of the resultant semiconductor body.

As an alternative to the aforementioned diffusion process, a second deposition technique known as the ion implantation method is commonly used. In this method dopant atoms are ionized and are then accelerated in the form of a high energy ion beam which is directed onto the semiconductor surface. The ions penetrate into the surface to a depth which is proportional to the energy of the beam. Variation of the ion beam intensity provides a means for precisely controlling impurity depth distribution and doping levels in the semiconductor.

The ion implantation method has an advantage over the above mentioned diffusion process in that it is an externally controlled non-equilibrium process, whereas the diffusion process is characterized by unchangeable physical conditions such as the diffusion constant of the impurity in the semiconductor material. Unfortunately, considerable damage is done to the semiconductor crystal structure by the high energy ion penetration, and the ion stream has been known to drag impurities from remnant gas and from the semiconductor surface into the semiconductor.

A method known as sealed tube doping was in frequent use during the early days of semiconductor device fabrication. According to this method, the semiconductor substrate and a solid-state dopant are sealed in an evacuated tube. The tube is then heated to a predetermined temperature whereby the solid state dopant evaporates and diffuses into the semiconductor substrate. Control of the doping level by variation of temperature and dopant quantities is possible but this method is not applicable for mass production.

All prior art methods for diffusing active impurities into a semiconductor substrate suffer from an inability to provide optimal dopant concentrations and distributions and to eliminate unwanted impurity inclusion in the semiconductor substrate. The prior art methods also suffer from an inability to provide precise and accurate control of simultaneous deposition of two or more dopants. The simultaneous deposition of two or more dopants is for example necessary in the production of certain devices requiring semiconductor layers with very high dopant concentrations and high carrier lifetimes. Bipolar transistors with high efficiency emitters, and solar cells are but two examples of such devices.

SUMMARY OF THE INVENTION

The instant invention is a method and apparatus for carrying out the method of diffusing optimal dopant concentrations and distributions into a semiconductor substrate while eliminating unwanted impurity inclusion. The method further allows for precise accurate control of simultaneous deposition of two or more dopants while guarding against lattice distortions and damage to the semiconductor crystal structure. In addition, the inventive method is applicable to mass production techniques.

In general the invention is a method for diffusing one or more impurities into a semiconductor body comprising the steps of placing the body in a vacuum chamber, creating a vacuum in the chamber, and admitting one or more continuous flows of gas or vapor phase forms of dopants in predetermined proportions into the chamber. The one or more flows exert a predetermined pressure on a surface of the body. The body is heated to a predetermined temperature which is sufficient to initiate one or more reactions between respective ones of the dopants and the surface, such the predetermined amounts of respective ones of the dopants diffuse into the body thus forming a layer having a depth which is proportional to the temperature and time, and having respective dopant concentrations which are proportional to the predetermined proportions and the pressure.

The invention is also a method of diffusing one or more impurities into a semiconductor body comprising the steps of placing the body in a vacuum chamber, creating a vacuum in the chamber, admitting one or more continuous flows of gas or vapor phase forms of dopant compounds into the chamber, and admitting a continuous flow of a reactive gas into the chamber, the continuous flows exert a predetermined pressure on a surface of the body. The body is then heated to a predetermined temperature whereby the dopant compounds and the reactive gas react to produce respective ones of elementary dopants, or intermediate compounds which react with the surface to produce the elementary dopants, such that the temperature is sufficient to initiate the reactions between respective ones of the elementary dopants and the surface such that a predetermined amount of the elementary dopants diffuse into the body forming a layer having a depth which is proportional to the temperature and time and having respective dopant concentrations which are proportional to the pressure.

The invention is also an apparatus for diffusing one or more impurities into a semiconductor body comprising a first refractory container connected to a device for creating a vacuum therein, and a regulating device connected to the first container and the vacuum device for maintaining a predetermined pressure within the first container. The device further includes a structure for supporting one of more of the semiconductor bodies within the first container, heating apparatus for heating the first container to a predetermined temperature, one or more second containers (which can be refactory) for respectively containing one or more dopants, and one or more gas flow controllers connected to respective ones of the second containers and to the first container for admitting one or more continuous flows of the dopants in predetermined proportions from respective ones of the second containers to the first container. The predetermined temperature is sufficient to initiate one or more reactions between respective ones of the dopants and a surface of the body such that predetermined amounts of respective ones of the dopants diffuse into the body thus forming a layer having a depth which is proportional to the predetermined temperature and time, and having respective dopant concentrations which are proportional to the predetermined proportions and the pressure.

These and other aspects and advantages of the present invention will become more readily apparent from the following description of an illustrative embodiment thereof, including the drawings.

DETAILED DESCRIPTION

Figure 1:
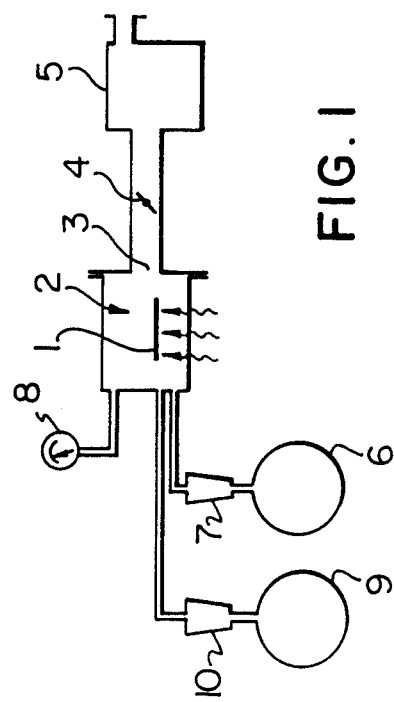
FIG. 1 shows the basic arrangement of an apparatus suitable for diffusing an impurity layer into a semiconductor body in accordance with the principles of the present invention.

Referring to FIG. 1 which depicts an apparatus which is suitable for diffusing an impurity layer provided by two dopant gases into a semiconductor body, a semiconductor substrate 1 is placed into a vacuum chamber 2 made from a suitable material, e.g. refractory material. An airtight access port 3 is closed and chamber 2 is evacuated through a pressure control gate 4 by a vacuum pump 5. A gas or vapour phase dopant is then admitted into the chamber 2 from a source vessel 6 with a predetermined gas flow rate through a flow controlling device 7. Dopant gas pressure in the chamber 2 is monitored by a pressure monitoring device 8. A predetermined dopant pressure is maintained for a predetermined length of time whereby a predetermined doping level is reached. The substrate 1 is heated to at least a temperature at which a surface reaction occurs between the dopant and the substrate 1.

An advantage of the instant invention over prior art inventions is that any number of dopant sources can be used. The arrangement of FIG. 1 shows a second source vessel 9 containing a second gas or vapor phase dopant for admittance to chamber 2. The gas flow rate of the second dopant is controlled by flow controlling device 10.

A dopant may be used either in elementary form if its vapour pressure is sufficient, or bound into a chemical compound. The latter must react with the surface of substrate 1 in such a way that one of the reaction products is the elementary dopant.

Elementary dopant atoms deposited on the surface of substrate 1 diffuse into the substrate material in accordance with the laws of solid-state diffusion, i.e. dependent upon temperature and time.

The rate of deposition and the rate of dopant diffusion into substrate 1 can be independently controlled by this new method, while the total amount of dopant diffused into the substrate is determined by the length of time of the entire process.

By choosing the gas pressure in chamber 2 as one independent parameter and the temperature of substrate 1 as another parameter, various dopant concentrations and distributions can be realized with the inventive method. High gas pressure and low substrate temperature result in a high doping concentration in a very shallow surface layer of the substrate 1. Lowering the gas pressure and increasing the substrate temperature enables the process to yield lighter doping concentrations and deeper doped layers. Variation of the gas pressure or the substrate temperature, or both of these parameters during the process allows for the creation of doping distribution profiles which are different from profiles achieved through standard diffusion methods.

Figure 2:
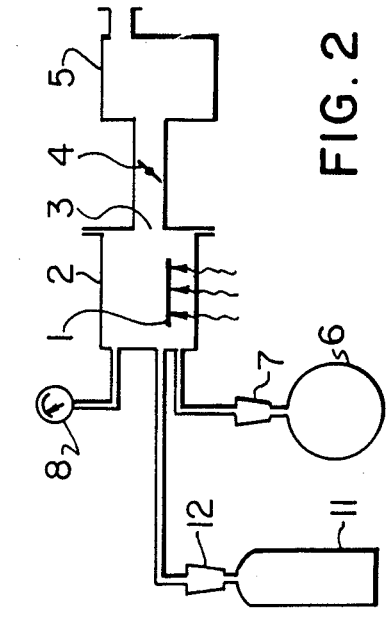
FIG. 2 shows a modified arrangement of the apparatus suitable for diffusing an impurity layer into a semiconductor body in the presence of an additional reactive gas.

Referring now to FIG. 2, a modified arrangement of an apparatus suitable for diffusing an impurity layer into a semiconductor body in the presence of an additional reactive gas is shown. If the chemical compound of the dopant does not directly react with the surface of substrate 1, or if it is necessary to modify the surface reaction of the reaction products, then an additional reactive gas is admitted into the chamber. The reactive gas reacts with the dopant compound resulting in either the elementary dopant or an intermediate compound which reacts with the substrate surface to produce the elementary dopant. A reactive gas such as oxygen is necessary for example in order to dope silicon with phosphine.

The reactive gas, contained in a vessel 11, is admitted through a flow controlling device 12 into the chamber 2 simultaneously with the dopant gas contained in vessel 6. The ratio of the dopant gas to the reactive gas is controlled by respective flow controlling devices, 7 and 12. The dopant gas and reactive gas undergo a reaction which produces the elementary dopant or an intermediate compound which reacts further with the surface of substrate 1 thus producing the elementary dopant. The elementary dopant then reacts with substrate 1 as described above for the embodiment of FIG. 1. Through the use of a reactive gas it is possible to achieve a high concentration of impurities in the semiconductor body, and low defect density.

Figure 3:
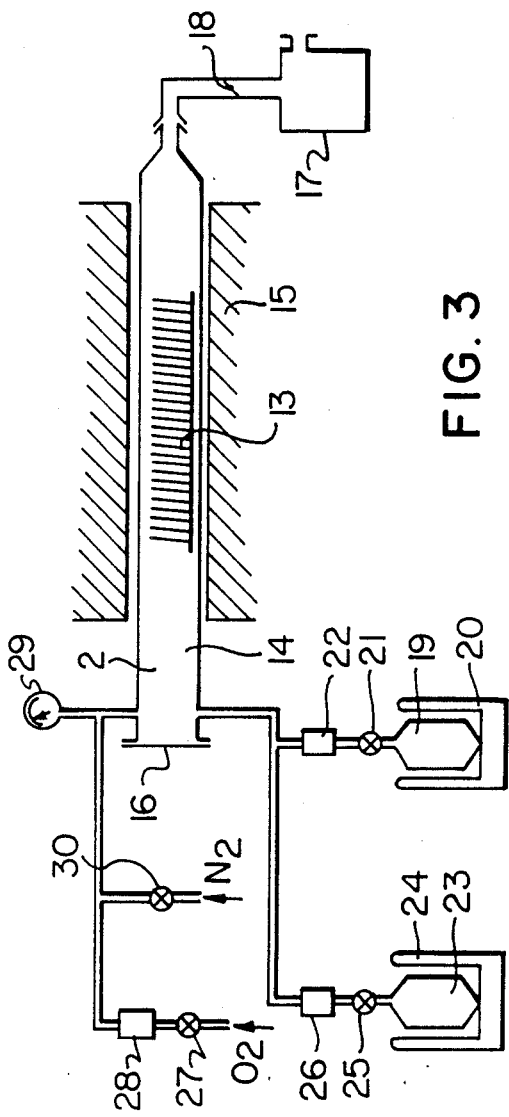
FIG. 3 shows a modified arrangement of the apparatus suitable for diffusing an impurity layer provided by two dopant gases into a semiconductor body in the presence of an additional reactive gas.

Referring now to FIG. 3, apparatus is illustrated for implementing the basic method according to this invention for realizing the manufacture of semiconductor devices. The apparatus illustrated in FIG. 3 provides an arrangement by which simultaneous pressure controlled multidoping of semiconductor substrates is realized in the presence of a reactive gas. A set of semiconductor wafers 13 are arranged on a rectangular quartz rod called a boat. The boat is inserted in a vacuum doping chamber 14. One end of the chamber 14 is closed by an access door 16, the other end being connected to a vacuum pump 17. A pressure control gate 18 is used to adjust the pressure in chamber 14. Chamber 14 is then evacuated via vacuum pump 17 through fully opened pressure control gate 18. The chamber 14 and the wafers 13 are then heated by a furnace 15. A first dopant e.g., an arsenic compound such as $AsCl_3$, contained in vessel 19 is heated by a heating mantle 20 to obtain a vapour pressure sufficiently high to supply a first continuous vapour flow to the chamber 14. This vapour flow is controlled by a valve 21 and a flow controlling device 22. A second dopant e.g., a phosphorous compound such as $POCl_3$, contained in vessel 23 is heated by a mantle 24 to obtain a sufficiently high vapour pressure to supply a second continuous vapour flow. The second vapour flow is controlled by a valve 25 and a flow controlling device 26. A supply of reactive gas such as oxygen is connected to the chamber 14 through a valve 27 and a flow controlling device 28. When a temperature equilibrium in the chamber 14 has been established, valves 21, 25 and 27 are opened and the gases begin to flow through the respective preset flow controlling devices 22, 26 and 28. The gas pressure in the chamber 14 is monitored by a pressure meter 29. The gas pressure and the wafer temperature are set to predetermined levels for which a predetermined doping profile may be created. A controlled gas atmosphere is maintained in chamber 14 until a predetermined necessary amount of dopants are diffused into the wafers. The gas admittance valves 21, 25 and 27 are then closed and chamber 14 is evacuated to remove the gases. Finally gate 18 is closed and the chamber 14 is filled with an inert carrier gas such as nitrogen via valve 30.

EXAMPLE 1

The apparatus shown in FIG. 1 and described above is used in the practice of this example. One N-type dopant gas is used. A silicon or germanium substrate 1 is placed into the vacuum chamber 2 which is made of quartz. All gas from vacuum chamber 2 is evacuated via vacuum pump 5 through pressure control gate 4. Vacuum pressure control gate 4 controls the pressure in chamber 2. The silicon substrate 1 is heated to about 700–1200° C. (or about 500–900° C., for a germanium substrate). The dopant gas phosphine ($PH_3$), or phosphorous oxychloride ($POCl_3$), is admitted into chamber 2 from source vessel 6 through flow controlling device 7. The dopant gas pressure in the chamber 2 is maintained at about 400 mTorr and monitored by the pressure monitoring device 8. The dopant gas $POCl_3$ reacts with the surface of silicon substrate 1, as follows:

$$POCl_3 + Si \rightarrow SiO_2 + Cl_2 + P$$

In this case one of the reaction products on the surface of silicon substrate 1 is the elementary dopant.

EXAMPLE 2

The apparatus shown in FIG. 2 and described above is used in the practice of this example. One N-type dopant gas is used. A silicon substrate 1 is placed in vacuum chamber 2. The substrate 1 is heated to about 800° C. The dopant gas $PH_3$ from source vessel 6 is admitted into chamber 2 through the flow controlling device 7. The flow rate of the phosphine $PH_3$ is set at 10 ml/min. A reactive gas, such as oxygen is then admitted into chamber 2 from source vessel 11 through a flow controlling device 12.

The impurity gas or vapour $PH_3$ reacts with the oxygen:

$$PH_3 + O_2 \rightarrow P_2O_5$$

The reaction gas $P_2O_5$ then reacts with the surface of silicon substrate 1:

$$P_2O_5 + Si \rightarrow SiO_2 + P$$

The time for all reactions in doping chamber 2 is about one hour.

TABLE I

| P (mTorr) | $PH_3$ (phosphine) $O_2$ (oxygen) ratio between reacting gases | | R (μ/α) |
|---|---|---|---|
| 150 | 1 | 13 | 500 |
| 110 | 1 | 4 | 300 |
| 400 | 1 | 4 | 8–9 |

Table 1 illustrates the sheet resistance of 3 diffused silicon bodies produced in accordance with the present method and employing phosphine as the source of impurity, phosphorus pentoxide $P_2O_5$ being generated as an intermediate source material. As can be seen from the results of Table 1, by varying the proportions between dopant gas and reactive gas and changing the pressure in the chamber 2, it is possible to achieve a very low level of sheet resistance, which is of particular importance in the manufacture of bipolar transistor emitters or source or drain areas of field-effect devices. The use of a reactive gas results in more heavily concentrated diffusions.

EXAMPLE 3

The apparatus shown in FIG. 3 and described above is used in the practice of this example. Two N-type dopant gases such as phosphorus and arsenic compounds are used. A set of silicon wafers 13 is placed in a quartz tube 14. The tube 14 and the wafers 13 are heated by a furnace 15. One end of the tube 14 is closed by an access door 16, while the other end is connected to a vacuum pump 17. Chamber 2 is then evacuated as described above. A pressure control gate 18 is provided for adjusting the pressure in chamber 2. An arsenic compound, such as arsenic trichloride ($AsCl_3$), is heated in vessel 19 to about 110° C. by mantle 20 in order to obtain a sufficiently high vapour pressure to supply the vapour flow. This vapour flow is controlled by valve 21 and flow controlling device 22. A phosphorous compound, such as phosphorous oxychloride ($POCl_3$) contained in vessel 23 is heated by a mantle 24 to about 95° C. The vapour flow of phosphorous compound is controlled by valve 25 and flow controlling device 26. An amount of oxygen necessary to support the doping reaction is admitted into chamber 2 through valve 27 and flow controlling device 28.

The gas pressure and wafer temperature are set to predetermined levels which result in a desired doping profile. The controlled gas atmosphere is maintained in the tube for a predetermined length of time during which the necessary amount of dopants are diffused into the wafer. The gas admittance valves 21, 25 and 27 are then closed and chamber 2 is evacuated to remove the gases. Finally, gate 18 is closed and the tube is filled with nitrogen via valve 30.

Dopant gases -phosphorous-oxychloride (POCl$_3$) and arsenic-trichloride (AsCl$_3$) react with oxygen as follows:

$$POCl_3 + O_2 \rightarrow P_2O_5 + Cl_2$$

$$AsCl_3 + O_2 \rightarrow As_2O_3 + Cl_2$$

Intermediate compounds P$_2$O$_5$ and As$_2$O$_3$ then react simultaneously with the silicon substrate:

$$P_2O_5 + Si \rightarrow SiO_2 + P$$

$$As_2O_3 + SiO_2 + As$$

The gas flow rates are 15 ml/min. for POCl$_3$ and 15 ml/min. for AsCl$_3$ and 50 ml/min. for oxygen. The gas flows are maintained for about 20 minutes and the wafer temperature due to furnace 15 is about 900° C. A defect free N-type diffusion layer of approximately 0.3 micrometers deep with very low sheet resistance is thus obtained.

EXAMPLE 4

The apparatus shown in FIG. 2 and described above is used in the practice of this example.

One P-type dopant gas is used. A set of gallium arsenide semiconductor substrates is placed in the vacuum chamber 2. Chamber 2 is evacuated as described above. Gaseous diethylzinc (Zn(CH$_3$)$_2$), contained in vessel 6 is permitted to flow into chamber 2, the flow rate being controlled by flow controlling device 7. The temperature of furnace 15 is maintained at about from 400° C. to 700° C. The process is completed as described above in Example 3.

Although the foregoing is set forth as a full and complete description of a disclosed embodiment of the present invention, it will be apparent to those skilled in the art that numerous alterations and modifications may be made therein without departing from the spirit and the scope of the present invention as defined in the following claims.

I claim:

1. A method of diffusing a plurality of impurities into a semiconductor substrate, comprising the steps of:
   (a) placing said substrate in a vacuum chamber, said substrate having a surface,
   (b) creating a vacuum in said chamber,
   (c) admitting a plurality of continuous flows of gas or vapor phase forms of different dopants in predetermined proportions into said chamber so as to simultaneously react with the surface of the substrate,
   (d) controlling a plurality of flows so as to maintain a predetermined pressure of the flows against said surface of said substrate, and
   (e) heating said substrate to a predetermined temperature for a predetermined length of time sufficient to initiate one or a plurality of reactions between respective ones of the dopants and said semiconductor surface, so that predetermined amounts of respective ones of the dopants diffuse into said substrate to a depth which is proportional to said temperature and time and in accordance with respective dopant concentrations which are proportional to said predetermined proportions and said pressure, whereby said controlling so as to maintain a predetermined pressure and said heating to a predetermined temperature for a predetermined time enables various dopant densities and dopant distributions in said substrate to be achieved.

2. A method as defined in claim 1 wherein the semiconductor substrate is comprised of silicon, one dopant is comprised of phosphine, the predetermined temperature is approximately 700°-1200° C. and the predetermined pressure is approximately 400 mTorr.

3. A method as defined in claim 1 wherein the semiconductor substrate is comprised of germanium and the predetermined temperature is approximately 500-900° C.

4. A method of diffusing a plurality of impurities into a semiconductor substrate, comprising the steps of:
   (a) placing said substrate in a vacuum chamber, said substrate having a surface,
   (b) creating a vacuum in said chamber,
   (c) admitting a plurality of continuous flows of gas or vapor phase forms of different dopant compounds into said chamber so as to simultaneously react with the surface of the substrate,
   (d) admitting a continuous flow of a reactive gas into said chamber,
   (e) controlling said continuous flows of dopant compounds and reactive gas so as to maintain a predetermined pressure of the flows against said surface of said substrate, and
   (f) heating said substrate to a predetermined temperature for a predetermined length of time, so that respective ones of the dopant compounds react with the reactive gas to produce respective ones of elementary dopants, or intermediate compounds which react with said surface of the substrate to produce the elementary dopants, said temperature being sufficient to initiate one or a plurality of reactions between respective ones of the elementary dopants and said surface such that a predetermined amount of respective ones of the elementary dopants diffuse into said substrate to a depth which is proportional to said temperature and time and in accordance with respective dopant concentrations which are proportional to said predetermined proportions and said pressure, whereby said controlling so as to maintain a predetermined temperature for a predetermined time enables various dopant densities and dopant distribution in said substrate to be achieved.

5. A method as defined in claim 4 wherein said semiconductor substrate is comprised of silicon, one dopant is comprised of phosphine, said flow of phosphine is approximately 10 ml/min., said reactive gas is oxygen, said flow of oxygen is approximately 40 ml/min., said predetermined temperature is approximately 800° C., said time is about one hour, said pressure is approximately 400 mTorr., and an intermediate compound is phosphorous pentoxide.

6. A method as defined in claim 4 wherein said semiconductor substrate is comprised of silicon, said plurality of continuous flows are admitted into said chamber so as to provide a plurality of dopants, said plurality of dopants being comprised of arsenic trichloride and phosphorous oxychloride, said flow of arsenic trichloride is approximately 15 ml/min., said flow of phosphorous oxychloride is approximately 15 ml/min., said reactive gas is oxygen, said flow of oxygen is approximately 50 ml/min., said predetermined temperature is approximately 900° C., said time is 20 minutes, said intermediate compounds are phosphorous pentoxide and arsenic trioxide, and said depth is approximately 0.3 micrometers.

7. A method as defined in claim 4 wherein said semiconductor body is comprised of gallium arsenide, one dopant is comprised of diethylzinc, and said temperature is approximately 400-700° C.

* * * * *